(12) United States Patent
Chen

(10) Patent No.: US 7,838,967 B2
(45) Date of Patent: Nov. 23, 2010

(54) SEMICONDUCTOR CHIP HAVING TSV (THROUGH SILICON VIA) AND STACKED ASSEMBLY INCLUDING THE CHIPS

(75) Inventor: Ming-Yao Chen, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 342 days.

(21) Appl. No.: 12/108,903

(22) Filed: Apr. 24, 2008

(65) Prior Publication Data

US 2009/0267194 A1  Oct. 29, 2009

(51) Int. Cl.
*H01L 23/488* (2006.01)
(52) U.S. Cl. .................... 257/621; 257/686; 257/774; 257/777; 257/E23.01; 257/E23.023
(58) Field of Classification Search .......... 257/621, 257/686, 774, 777, E23.01, E23.23
See application file for complete search history.

(56) References Cited

U.S. PATENT DOCUMENTS

| 5,408,123 | A | * | 4/1995 | Murai | 257/531 |
|---|---|---|---|---|---|
| 6,566,232 | B1 | * | 5/2003 | Hara et al. | 438/455 |
| 6,577,013 | B1 | * | 6/2003 | Glenn et al. | 257/777 |
| 6,848,177 | B2 | * | 2/2005 | Swan et al. | 29/852 |
| 6,908,785 | B2 | | 6/2005 | Kim | |
| 7,091,592 | B2 | | 8/2006 | Chen et al. | |
| 2003/0151144 | A1 | * | 8/2003 | Muta et al. | 257/774 |
| 2008/0032448 | A1 | * | 2/2008 | Simon et al. | 438/107 |

* cited by examiner

*Primary Examiner*—Wael M Fahmy
*Assistant Examiner*—Peniel M Gumedzoe
(74) *Attorney, Agent, or Firm*—Muncy, Geissler, Olds & Lowe, PLLC

(57) ABSTRACT

A semiconductor chip having through silicon vias (TSV) and a stacked assembly including the chip are revealed. The chip has a plurality of first and second bonding pads disposed on two opposing surfaces of a semiconductor substrate respectively. Through hole vertically penetrate through the semiconductor substrate and the first and second bonding pads. By forming first extruded ring, the first bonding pad has a first contact surface located between the first extruded ring and the through hole. By forming second extruded ring, the second bonding pad has a second contact surface located outside and adjacent to the second extruded rings to encircle the second extruded ring. The second extruded ring has a proper dimension to fit in the first extruded ring. Accordingly, a plurality of semiconductor chip can be stacked each other with accurate alignment without shifting to effectively reduce the stacked assembly height, moreover, chip stacking processes are accomplished by vertically stacking a plurality of chips first then filling conductive material into the through holes without electrical short between the adjacent bonding pads due to overflow of conductive material to meet the fine-pitch requirements of TSV. The process flow for the stacked assembly is simplified with higher production yields.

21 Claims, 6 Drawing Sheets

SEMICONDUCTOR CHIP HAVING TSV (THROUGH SILICON VIA) AND STACKED ASSEMBLY INCLUDING THE CHIPS

FIELD OF THE INVENTION

The present invention relates to semiconductor devices, especially to a semiconductor chip having TSV (Through Silicon Via) and a stacked assembly including the chips.

BACKGROUND OF THE INVENTION

In conventional semiconductor chips, ICs are formed on the active surfaces of the semiconductor chips with conventional electrical terminals such as bonding pads formed on the active surface. In high-density electrical interconnections, 3D chip stacking was developed with electrical terminals not only disposed on the active surfaces but also on the corresponding back surfaces of the semiconductor chips. Through Silicon Via (TSV) is the enabled technology to vertically stack several chips to assemble 3D chip stacking packages or modules with high powers, high densities, and smaller dimensions. TSV's are electrically-conductive through holes inside a chip penetrating through the top surface and the bottom surface of a chip to create vertical electrical connections without any interposers nor bonding wires. TSV provides directly vertical electrical connections not go through the sidewalls at the edges of the chips to shorten the electrical paths. TSV can further enhance the integration and the performance of an electronic device to greatly reduce the packaging heights and dimensions, to increase the speeds, and to decrease the power consumption of an electronic device. However, each chip will generate heat during operation, therefore, the induced thermal stresses will cause the chip to deform or to warpage and even to break the electrical connections of TSV where stresses are concentrated.

In U.S. Pat. No. 7,091,592 B2 Chen et al. discloses a semiconductor chip with TSV for 3D chip stacking. Each chip has a plurality of through holes with corresponding stud bumps formed by wire bonding inside the through holes. Then the chips are vertically stacked and electrically connected by the stud bumps. However, when the chip experiences thermal stresses causing deformation or warpage, the electrical connections formed by the stud bumps located between the chips are easily broken due to thermal stresses leading to electrical failure.

In U.S. Pat. No. 6,908,785 B2 Kim discloses a semiconductor chip with TSV as shown in FIG. 1. A conventional semiconductor chip 100 primarily comprises a semiconductor substrate 110 and a plurality of conductive metals 120. The semiconductor substrate 110 has a first surface 111, a corresponding second surface 112, and a plurality of through holes 113 penetrating from the first surface 111 to the second surface 112. The conductive metals 120 are disposed inside the through holes 113 and connected with electrical terminals on the first surface 111 and the second surface 112. The through holes 113 with conductive metals 120 disposed inside become TSV. As shown in FIG. 2 again, a plurality of conductive pins 12 are pre-disposed on a plurality of connection pads 11 on the carrier 10 as vertical electrical connections between a plurality of semiconductor chips 100 vertically stacked together. However, in order to electrically connect all the semiconductor chips 100 to the carrier 10, all the conductive pins 12 have to be straight without any bending nor deformation nor shifting and are accurately aligned and inserted into all the corresponding through holes 113. Once one of the conductive pins 12 or the semiconductor chips 100 is bent or deformed or shifted during stacking processes, the conductive pins 12 can not easily insert into the through holes 113 of the semiconductor chips 100 stacked afterwards leading to alignment issues and poor production yields.

SUMMARY OF THE INVENTION

The main purpose of the present invention is to provide a semiconductor chip having TSV and a stacked assembly including the chips. A plurality of chips are vertically stacked and electrically connected by TSV to effectively reduce the assembly heights and dimensions. Moreover, the stacked assembly is formed by vertically stacking a plurality of chips first, then filling conductive materials into the TSV without electrical short between the adjacent TSV due to overflow of conductive materials to meet the fine-pitch requirements of TSV. Comparing to the conductive pins inserted into through holes in the conventional structures, the process flow of the present invention is simplified with higher production yields.

The second purpose of the present invention is to provide a semiconductor chip having TSV and a stacked assembly including the chips to vertically stack different dimensions of chips to effectively enhance the accurate alignment during vertical stacking and to increase versatile functions of a stacked semiconductor device.

The third purpose of the present invention is to provide a semiconductor chip having TSV and a stacked assembly including the chips to replace the conductive pins on carrier for inserting into the through holes of the chips to reduce the manufacturing cost of a substrate.

The fourth purpose of the present invention is to provide a semiconductor chip having TSV and a stacked assembly including the chips to achieve accurate alignment of vertically stacked chips without any shifting by the extruded rings.

According to the present invention, a semiconductor chip having TSV primarily comprises a semiconductor substrate, a plurality of first bonding pads, a plurality of second bonding pads, a plurality of first extruded rings, and a plurality of second extruded rings. The semiconductor substrate has a first surface, a corresponding second surface, and a plurality of through holes penetrating from the first surface to the second surface. The first bonding pads are disposed on the first surface and the second bonding pads on the second surface. The through holes further vertically penetrate through the corresponding first bonding pads and the second bonding pads. The first extruded rings are extrusively disposed on the first bonding pads in a manner that each first bonding pad has a first contact surface exposed from the first surface and located between the first extruded rings and the through holes. The second extruded rings are extrusively disposed on the second bonding pads in a manner that each second bonding pad has a second contact surface exposed on the second surface and located outside and adjacent to the second extruded rings to encircle the second extruded rings. Additionally, the second extruded rings have a dimension to fit into the first extruded rings.

DETAIL DESCRIPTION OF THE INVENTION

Please refer to the attached drawings, the present invention are described by means of embodiments below.

Figure 1:
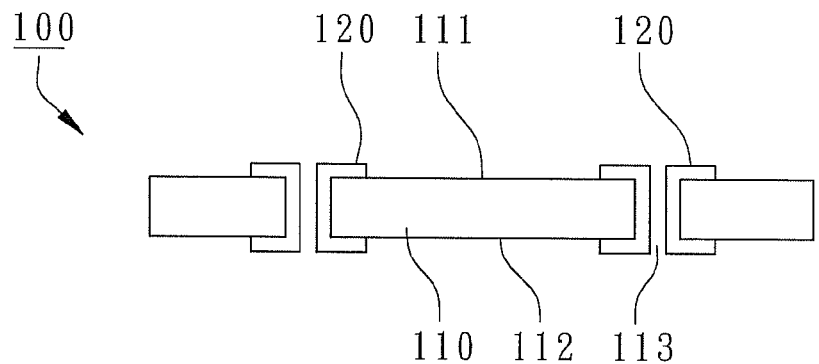
FIG. 1 shows a cross-sectional view of a conventional semiconductor chip with TSV.
Figure 2:
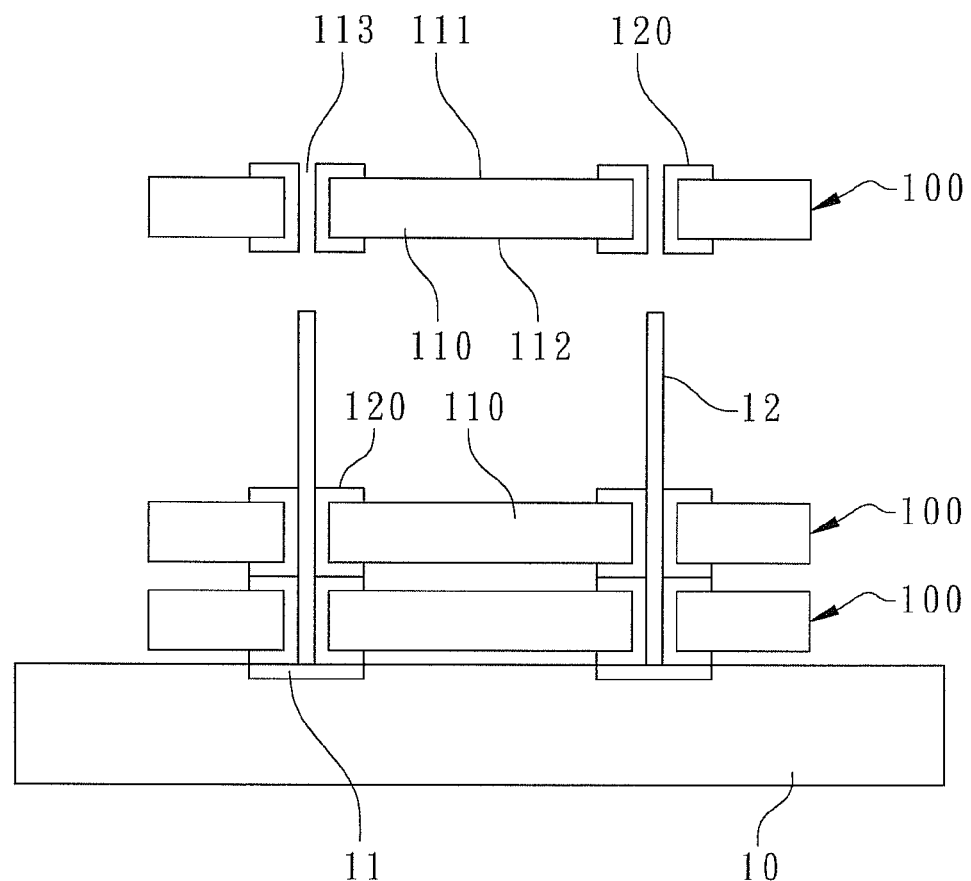
FIG. 2 shows a cross-sectional view of a conventional stacked assembly including a plurality of semiconductor chips
Figure 3:
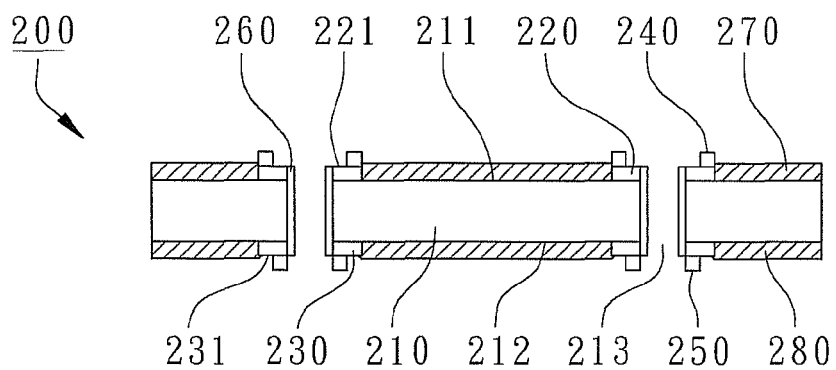
FIG. 3 shows a cross-sectional view of a semiconductor chip with TSV according to the first embodiment of the present invention.

The first embodiment of the semiconductor chip having TSV of the present invention is illustrated in the cross-sectional view of FIG. 3. The semiconductor chip 200 with TSV configuration primarily comprises a semiconductor substrate 210, a plurality of first bonding pads 220, a plurality of second bonding pads 230, a plurality of first extruded rings 240, and a plurality of second extruded rings 250. The semiconductor substrate 210 has a first surface 211, a corresponding second surface 212, and a plurality of through holes 213 penetrating from the first surface 211 to the second surface 212. The semiconductor substrate 210 is made of semiconductor materials such as Si, GaAs, etc. Various ICs are formed on one surface of the semiconductor substrate 210 and electrically connected to a plurality of first bonding pads 220 and to a plurality of second bonding pads 230. Therein, the surface on which ICs are formed is an active surface. Preferably, the ICs are formed on the second surface 212 of the semiconductor substrate 210, i.e., the second surface 212 is the active surface of the chip. Low cost dielectric materials can be chosen as the electrical isolation layer on the first surface 211 of the semiconductor substrate 210 such as solder mask or others without contaminating the first bonding pads 220 which will be described in detail as follows.

The first bonding pads 220 are disposed on the first surface 211 of the semiconductor substrate 210. The second bonding pads 230 are disposed on the second surface 212 of the semiconductor substrate 210 and aligned with the first bonding pads 220. To be more specific, the first bonding pads 220 and the second bonding pads 230 are located adjacent to two opposing edges or peripheries of the first and second surfaces 211, 212 of the semiconductor substrate 210 to avoid overlapping of ICs fabrication areas. The through holes 213 not only penetrate through the semiconductor substrate 210 but also vertically penetrating through the corresponding first bonding pads 220 and the corresponding second bonding pads 230 to reduce the fabrication of RDL. To be more specific, the first and second bonding pads 220 and 230 are Al (aluminum) pads and the through holes 213 can be formed by laser drilling, RIE (reactive ion etching), LIGA, or plasma etching.

Figure 4:
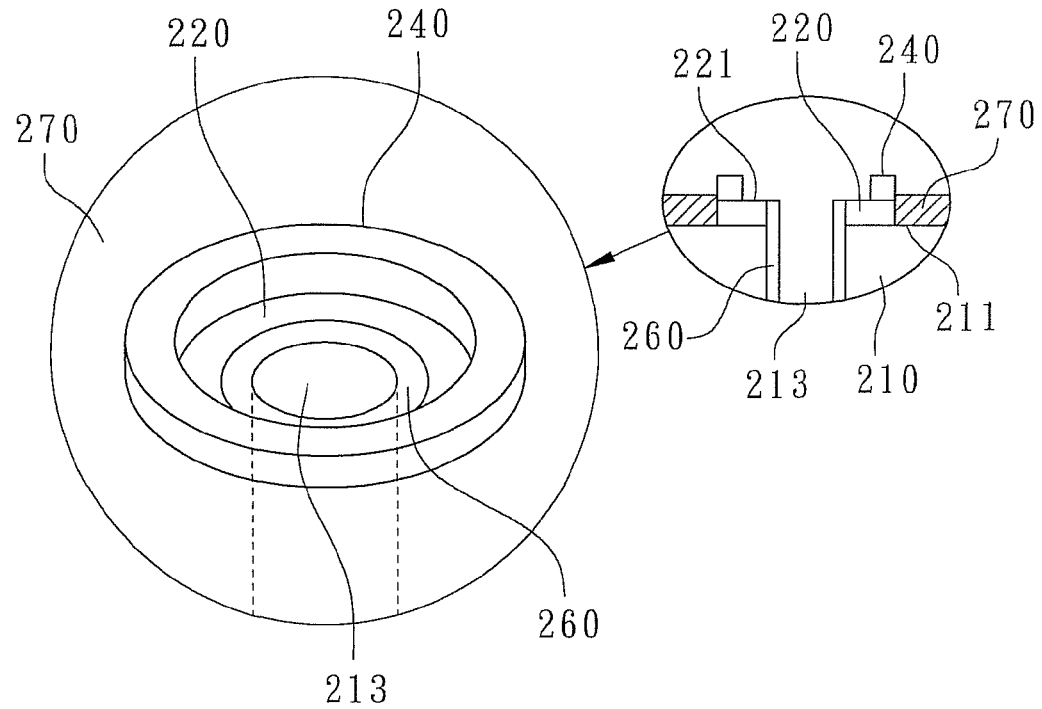
FIG. 4 shows a cross-sectional view and a three-dimensional view of a first extruded ring on a first bonding pad of the semiconductor chip according to the first embodiment of the present invention.

As shown in FIG. 3 and FIG. 4, the first extruded rings 240 are extrusively disposed on the first bonding pads 220 to partially cover the surfaces of the first bonding pads 220. By the disposition of the first extruded rings 240, each first bonding pad 220 has a first contact surface 221 exposed on the first surface 211 and located between the first extruded rings 240 and the through holes 213. In this embodiment, the first extruded rings 240 are circular rings on the peripheries of the first bonding pads 220. The first extruded rings 240 have an opening for accommodating the second extruded rings 250.

Figure 5:
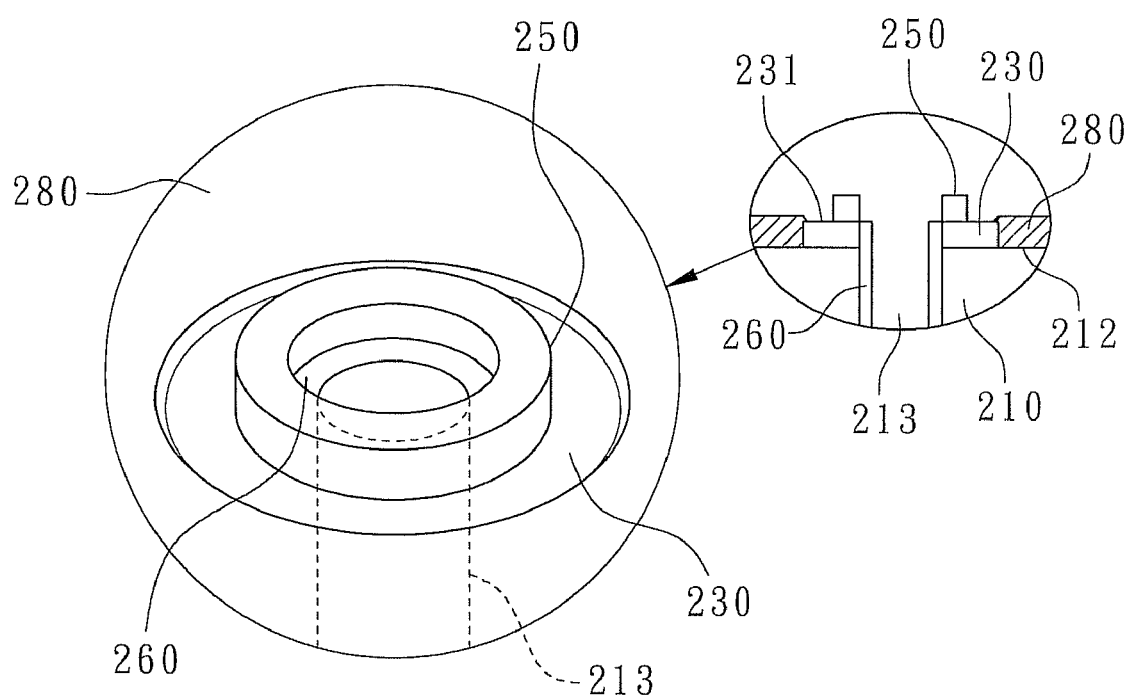
FIG. 5 shows a cross-sectional view and a three-dimensional view of a second extruded ring on a second bonding pad of the semiconductor chip according to the first embodiment of the present invention.

As shown in FIG. 3 and FIG. 5, the second extruded rings 250 are extrusively disposed on the second bonding pads 230 and aligned with the first extruded rings 240. The second extruded rings 250 partially cover the surfaces of the second bonding pads By the disposition of the second extruded rings 250, each second bonding pad 230 has a second contact surface 231 exposed on the second surface 212 and located outside and adjacent to the second extruded rings 250 to encircle the second extruded rings 250. Moreover, the second extruded rings 250 have proper dimensions to fit into the first extruded rings 240. The first extruded ring 240 and the second extruded ring 250 are made of conductive metals or conductive resins.

Figure 6:
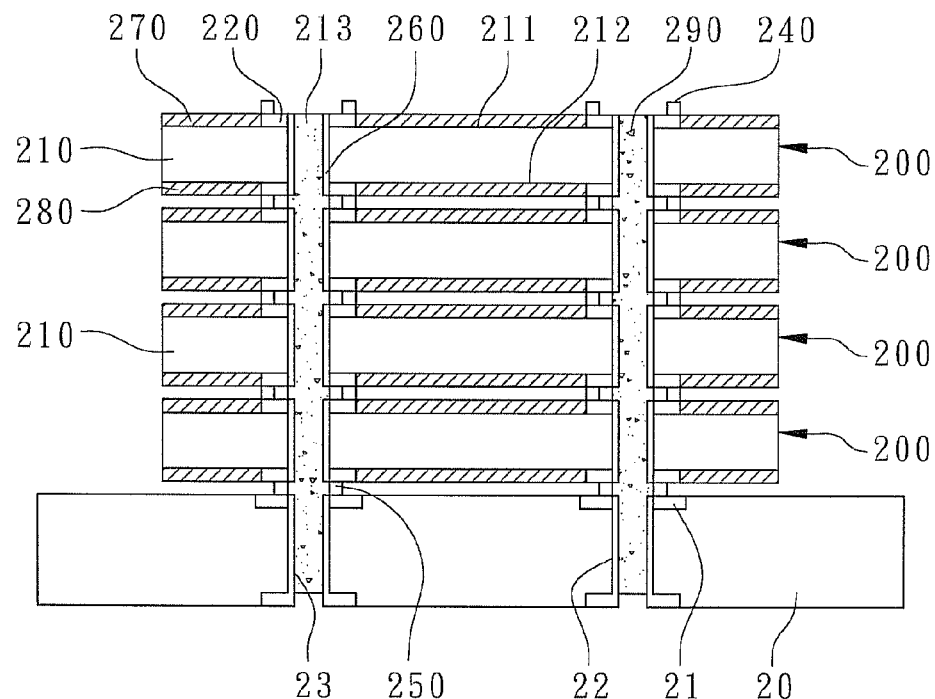
FIG. 6 shows a cross-sectional view of a stacked assembly including a plurality of semiconductor chips according to the first embodiment of the present invention.

To be more specific, as shown in FIG. 3 and FIG. 4, the semiconductor chip 200 further comprises a metal layer 260 formed inside the through holes 213 to electrically connect the first bonding pads 220 to the corresponding second bonding pads 230 to ensure smooth surfaces inside the through holes 213 to facilitate the filling flow of filling materials 290, as shown in FIG. 6, to achieve electrical connections between TSV. The metal layer 260 is formed by plating. Preferably, the metal layer 260, the first extruded rings 240 and the second extruded rings 250 are made of the same material to simplify the fabrication processes of the semiconductor chip 200. According to the actual processing experience of the metal layer 260, copper is a good and mature plated material with lower costs, therefore, the plated copper is preferred for the metal layer 260 but not limited.

In the present embodiment, since ICs are formed on the second surface 212 of the semiconductor substrate 210, the second surface 212 is an active surface. Referring to FIG. 3 and FIG. 5, a passivation layer 280 such as PSG is formed on the second surface 212 by IC fabrication processes. The passivation layer 280 has a plurality of openings aligned to the corresponding second bonding pads 230 to expose the second contact surfaces 231. By using the photolithography in IC fabrication processes, the formation area of the second contact surfaces 231 of the second bonding pads 230 can accurately be defined and controlled. The electrical isolation of the first surface 211 of the semiconductor substrate 210 has various selections with more flexibility. As shown in FIG. 3 and FIG. 4, preferably, the semiconductor chip 200 further comprises a solder mask 270 or other low-cost insulation layers covered the first surface 211 of the semiconductor substrate 210 to provide surface isolation and protection from the contaminations of moisture or dust particles. The insulation layer before curing is an ink, which can be formed by printing or other liquid-coating methods to achieve lower deposition costs. Moreover, the first extruded ring 240 is further extruded from the solder mask 270 and in contact with the solder mask 270 where the printed height of the solder mask 270 can be adjusted by its viscosity. Accordingly, the solder mask 270 can be dammed by the first extruded rings 240 to avoid flowing onto the first contact surface 221. A low-cost insulation on the backside of a chip with TSV is accomplished.

As shown in FIG. 6, a plurality of semiconductor chips 200 mentioned above are disposed on a carrier 20 and are stacked each other with the second surfaces 212 of the semiconductor chips 200 facing toward the carrier 20 to create vertical electrical connections of the through holes 213 of the semiconductor substrate 210. The carrier 20 is a printed circuit board, a ceramic substrate, a thin film, or a pre-mold leadframe to be a carrier to electrically connect the semiconductor chips 200. In the present embodiment, the carrier 20 has a plurality of connecting pads 21 on its top surface and a plurality of PTH 22 (Plated Through Holes) or via penetrating through the connecting pads 21 and the carrier 20. Therein, the PTHs 22 are aligned with the through holes 213 of the semiconductor substrates 210. A plated metal layer 23 is formed inside each PTH 22 to electrical connect the top surface and the bottom surface of the carrier 20.

Figure 7:
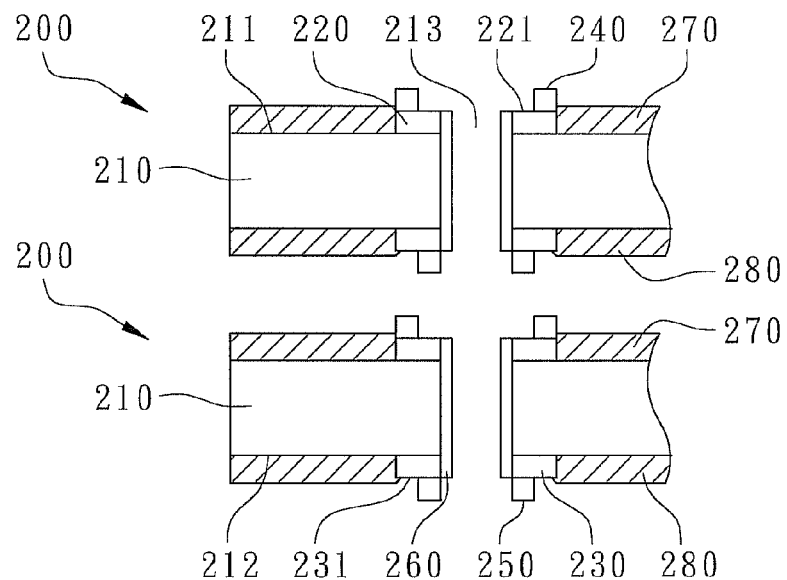
FIG. 7 shows a partially enlarged cross-sectional view of the stacked assembly after chip stacking according to the first embodiment of the present invention.

To be more specific, as shown in FIG. 7, during stacking, the second extruded rings 250 on the second surface 212 of the semiconductor substrate 210 stacked on top is aligned to and insert into the first extruded rings 240 on the first surface 211 of another semiconductor substrate 210 stacked below. Accordingly, a waveform dam is formed between the contact interface of the first and the second bonding pads 220 and 230 by the extruded rings 240 and 250 to avoid overflowing between the semiconductor chips 200 and to achieve accurate alignments of the semiconductor chips 200 without shifting.

As shown in FIG. 6, a filling material 290 completely fills into the through holes 213 to create electrical connections between the semiconductor chips 200. To be more specific, the filling material 290 is a conductive material such as solder paste, conductive paste containing copper, silver paste, or conductive printing ink. Preferably, the filling material 290 can further fill into the PTH 22 of the carrier 20 so that the stacked semiconductor chips 200 can vertically and electrically connect to the carrier 20. The PTH 22 of the carrier 20 can function as ventilation to enhance the filling flow of the filling material 290. When the filling material 290 reaches the spacing between the stacked semiconductor chips 200, the dam formed by the first extruded rings 240 and the second extruded rings 250 can prevent the overflow of the filling material 290 to avoid electrical short between the adjacent through holes 213 to meet the fine-pitch requirements of TSV. Comparing to the conventional TSV using the conductive pins, the process flow of the present invention is simplified with higher production yields.

Figure 8:
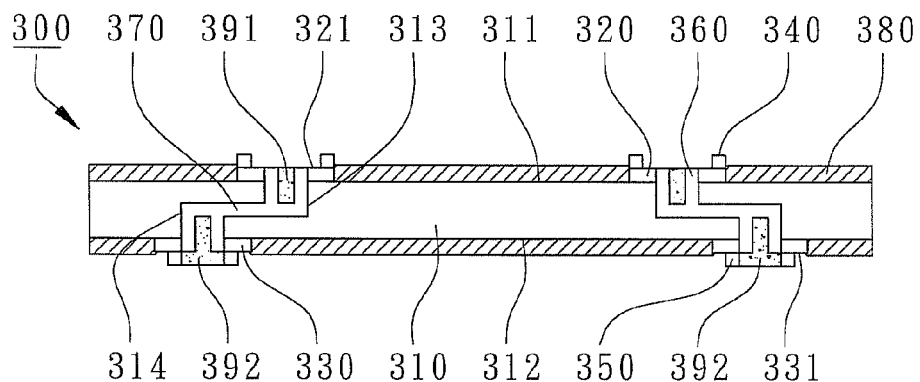
FIG. 8 shows a cross-sectional view of another semiconductor chip with TSV according to the second embodiment of the present invention.
Figure 9:
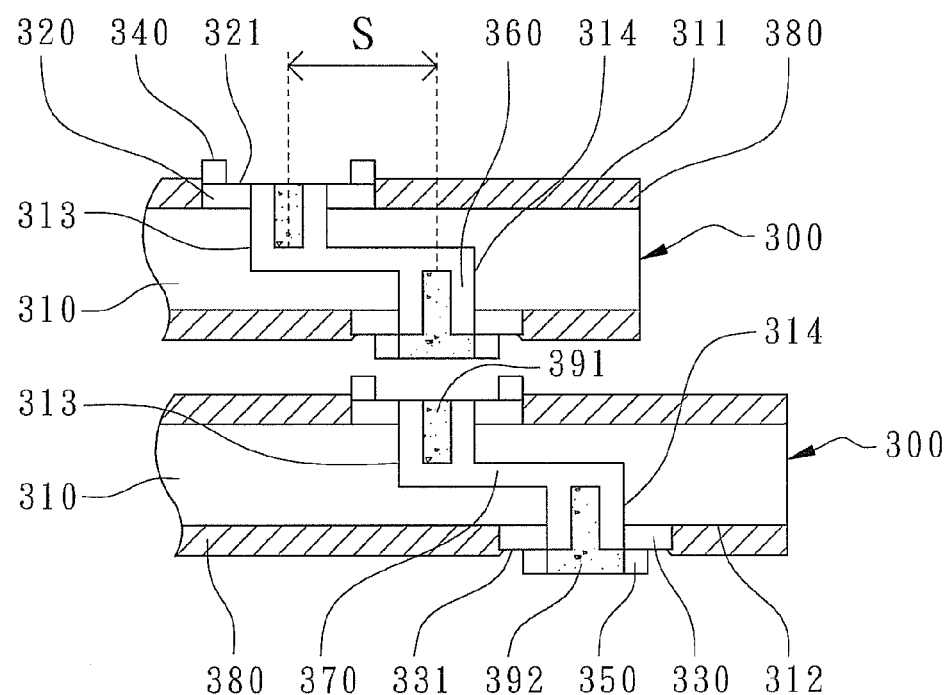
FIG. 9 shows a partially enlarged cross-sectional view of a plurality of stacked semiconductor chips to form a stacked assembly including according to the second embodiment of the present invention.

A second embodiment of the semiconductor chip having TSV of the present invention is illustrated in the cross-sectional view of FIG. 8. A stacked assembly including the chips is illustrated in the cross-sectional view of FIG. 9 and FIG. 10. The semiconductor chip 300 primarily comprises a semiconductor substrate 310, at least a first bonding pad 320, at least a second bonding pad 330, at least a first extruded ring 340, and at least a second extruded ring 350. The semiconductor substrate 310 has a first surface 311, a corresponding second surface 312, a first blind hole 313 in the first surface 211, and a second blind hole 314 in the second surface 212. To be more specific, the first blind hole 313 and the second blind hole 314 are blind vias formed by half-etching and plating, not penetrating through the semiconductor substrate 310. The first bonding pad 320 is disposed on the first surface 311 of the semiconductor substrate 310 with the first blind hole 313 penetrating through the first bonding pad 320. The second bonding pad 330 is disposed on the second surface 312 of the semiconductor substrate 310 with the second blind hole 314 penetrating through the second bonding pad 330. Moreover, there is a horizontal displacement S between the first blind hole 313 and the second blind hole 314 as shown in FIG. 9. Accordingly, the location of the first bonding pad 320 are not vertically corresponding to the one of the second bonding pad 330.

As shown in FIG. 8 and FIG. 9, the first extruded ring 340 is extrusively disposed on the first bonding pad 320 in a manner that the first bonding pad 320 has a first contact surface 321 exposed on the first surface 311 and located between the first extruded ring 340 and the first blind hole 313. Additionally, the second extruded ring 350 is extrusively disposed on the second bonding pads 330 in a manner that the second bonding pad 330 has a second contact surface 331 exposed on the second surface 312 and located outside and adjacent to the second extruded ring 350 to encircle the second extruded rings 350. Moreover, the second extruded ring 350 has a proper dimension to fit in the first extruded ring 340.

To be more specific, as shown in FIG. 8 and FIG. 9, the semiconductor chip 300 further comprises a metal layer 360 disposed inside the first blind hole 313 and the second blind hole 314 to electrically connect the first bonding pad 320 and the second bonding pad 330 respectively.

In order to provide better qualities of electrical connections, a first filling material 391 fills the first blind hole 313 and a second filling material 392 fills the second blind hole 314 where the filling materials 391 and 392 can be conductive or non-conductive filling materials, such as conductive paste containing copper or conductive printing ink. Preferably, the filling material 392 can further completely fill the second extruded ring 350 to reinforce the second extruded ring 350 and to increase electrical connecting area with the first contact surface 321 of the first bonding pads 320 of the semiconductor chip 300 stacked below, as shown in FIG. 9.

In the present embodiment, as shown in FIG. 9 again, since there is a horizontal displacement S between the first blind hole 313 and the second blind hole 314, a RDL 370 (redistribution wiring layer) is formed inside the semiconductor chip 300 to electrically connect the first blind hole 313 to the second blind hole 314. The horizontal displacement S changes the locations of the electrical terminals of the semiconductor chip 300, from the first bonding pad 320 to the non-vertically corresponding second bonding pad 330. The RDL 370 is formed by sputtering first, then followed by photolithography to define the trace pattern.

As shown in FIG. 8 and FIG. 9, the semiconductor chip 300 further comprises an insulation layer 380 to cover the first surface 311 and/or the second surface 312 where the first extruded ring 340 is extruded from the passivation 380 on the first surface 311.

Figure 10:
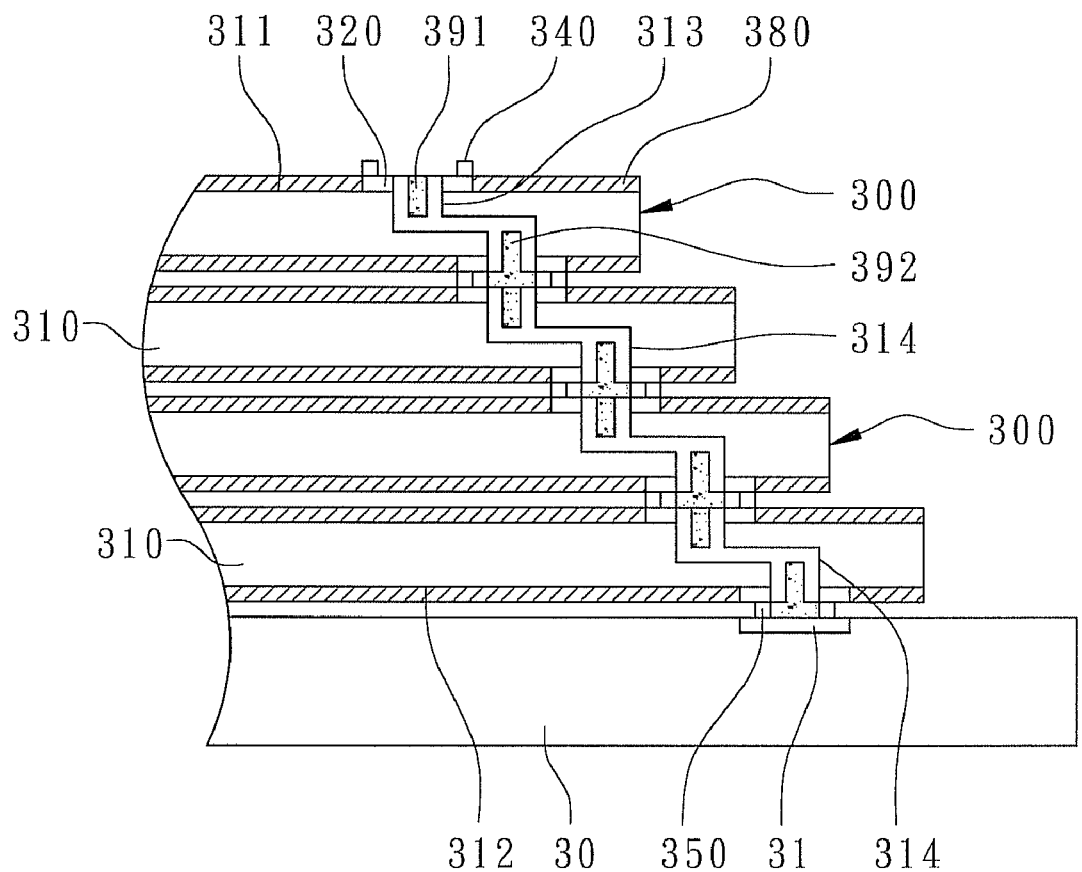
FIG. 10 shows a partial cross-sectional view of the stacked assembly according to the second embodiment of the present invention.

As shown in FIG. 10, when vertically stacking a plurality of semiconductor chips 300 with different dimensions, the second surfaces 312 face to the same direction when vertically stacking chips such as facing toward the carrier 30 where the second extruded rings 350 on the second surface 312 of the semiconductor substrate 310 stacked on top are aligned and inserted into the first extruded rings 340 on the first surface 311 of another semiconductor substrate 310 stacked below. The second extruded ring 350 of the semiconductor chip 300 located at the very bottom of the stacked assembly is aligned and bonded to the connecting pad 31 of the carrier 30 to achieve electrical connections between vertically stacked chips and to achieve accurate alignment of the semiconductor chips 300 without shifting. Therefore, in the present embodiment, chips with different dimensions can be vertically stacked into a stacked assembly.

The above description of embodiments of this invention is intended to be illustrative and not limiting. Other embodiments of this invention will be obvious to those skilled in the art in view of the above disclosure.

What is claimed is:

1. A semiconductor chip primarily comprising:
 a semiconductor substrate having a first surface, a corresponding second surface, a plurality of through holes penetrating from the first surface to the second surface;
 a plurality of first bonding pads disposed on the first surface;
 a plurality of second bonding pads disposed on the second surface and aligned with the first bonding pads, wherein the through holes further penetrate through the first bonding pads and the second bonding pads;

a plurality of first extruded rings extrusively disposed on the first bonding pads in a manner that each first bonding pad has a first contact surface exposed on the first surface and the first contact surfaces are located between the corresponding first extruded rings and the corresponding through holes; and a plurality of second extruded rings extrusively disposed on the second bonding pads in a manner that each second bonding pad has a second contact surface exposed on the second surface and the second contact surfaces are located outside and adjacent to the corresponding second extruded rings to encircle the corresponding second extruded rings; wherein the second extruded rings have a dimension to fit into the first extruded rings.

2. The semiconductor chip as claimed in claim 1, further comprising a metal layer formed inside the through holes to electrically connect the first bonding pads to the corresponding second bonding pads.

3. The semiconductor chip as claimed in claim 2, wherein the metal layer, the first extruded rings and the second extruded rings are made of the same material.

4. The semiconductor chip as claimed in claim 1, wherein the second surface of the semiconductor substrate is an active surface.

5. The semiconductor chip as claimed in claim 4, further comprising an insulation layer formed on the first surface of the semiconductor substrate, wherein the first extruded ring is further extruded from and in contact with the insulation layer.

6. The semiconductor chip as claimed in claim 5, wherein the insulation layer is a solder mask.

7. The semiconductor chip as claimed in claim 1, further comprising a filling material completely filling into the through holes.

8. A stacked assembly comprising a plurality of semiconductor chips vertically stacked on each other and a carrier, each semiconductor chip comprising:

a semiconductor substrate having a first surface, a corresponding second surface, a plurality of through holes penetrating from the first surface to the second surface;

a plurality of first bonding pads disposed on the first surface;

a plurality of second bonding pads disposed on the second surface and aligned with the first bonding pads, wherein the through holes further penetrate through the first bonding pads and the second bonding pads;

a plurality of first extruded rings extrusively disposed on the first bonding pads in a manner that each first bonding pad has a first contact surface exposed on the first surface and the first contact surfaces are located between the corresponding first extruded rings and the corresponding through holes; and a plurality of second extruded rings extrusively disposed on the second bonding pads in a manner that each second bonding pad has a second contact surface exposed on the second surface and the second contact surfaces are located outside and adjacent to the corresponding second extruded rings to encircle the corresponding second extruded rings; wherein the second extruded rings have a dimension for inserting into the first extruded rings.

9. The stacked assembly as claimed in claim 8, wherein each semiconductor chip further comprising a metal layer formed inside the through holes to electrically connect the first bonding pads to the corresponding second bonding pads.

10. The stacked assembly as claimed in claim 9, wherein the metal layer, the first extruded rings and the second extruded rings are made of the same material.

11. The stacked assembly as claimed in claim 8, wherein the second surface of the semiconductor substrate is an active surface.

12. The stacked assembly as claimed in claim 11, wherein each semiconductor chip further comprising an insulation layer is formed on the first surface of the semiconductor substrate, wherein the first extruded ring is, further extruded from and in contact with the insulation layer, and wherein the insulation layer is a solder mask.

13. The stacked assembly as claimed in claim 8, wherein each semiconductor chip further comprising a filling material completely filling into the through holes.

14. The stacked assembly as claimed in claim 13, wherein the carrier has a plurality plated through holes aligned with the through holes of the semiconductor substrate, wherein the filling material further fills into the plated through holes.

15. A semiconductor chip primarily comprising:

a semiconductor substrate having a first surface, a corresponding second surface, a first blind hole in the first surface and a second blind hole in the second surface, wherein there is a horizontal displacement between the first blind hole and the second blind hole;

a first bonding pad disposed on the first surface, wherein the first blind hole penetrates through the first bonding pad;

a second bonding pad disposed on the second surface, wherein the second blind hole penetrates through the second bonding pad;

a first extruded ring extrusively disposed on the first bonding pad in a manner that the first bonding pad has a first contact surface exposed on the first surface and located between the first extruded ring and the first blind hole; and a second extruded ring extrusively disposed on the second bonding pad in a manner that the second bonding pad has a second contact surface exposed on the second surface and located outside and adjacent to the second extruded ring to encircle the second extruded ring; wherein the second extruded ring has a dimension to fit in the first extruded ring.

16. The semiconductor chip as claimed in claim 15, further comprising a filling material completely filling into the first blind hole and the second blind hole.

17. The semiconductor chip as claimed in claim 16, wherein the filling material further fills into the second extruded ring.

18. The semiconductor chip as claimed in claim 15, further comprising a redistribution wiring layer (RDL) electrically connecting the first blind hole to the second blind hole.

19. The semiconductor chip as claimed in claim 18, further comprising a metal layer formed inside the first and second blind holes.

20. The semiconductor chip as claimed in claim 19, wherein the metal layer, the first extruded rings and the second extruded rings are made of the same material.

21. The semiconductor chip as claimed in claim 15, further comprising an insulation layer formed on the first surface of the semiconductor substrate, wherein the first extruded ring is extruded from and in contact with the insulation layer, and wherein the insulation layer is a solder mask.

* * * * *